United States Patent [19]
Lamotte et al.

[11] Patent Number: 5,989,777
[45] Date of Patent: Nov. 23, 1999

[54] HEAT MODE RECORDING ELEMENT BASED ON A THIN METALLIC RECORDING LAYER

[75] Inventors: Johan Lamotte, Rotselaar; Hartwig Andries, Diest, both of Belgium

[73] Assignee: AGFA-Gevaert, N. V., Mortsel, Belgium

[21] Appl. No.: 09/081,574

[22] Filed: May 19, 1998

Related U.S. Application Data

[60] Provisional application No. 60/053,360, Jul. 17, 1997.

[30] Foreign Application Priority Data

Jun. 18, 1997 [EP] European Pat. Off. .............. 97201820

[51] Int. Cl.$^6$ ....................................... G03F 7/11
[52] U.S. Cl. ...................... 430/271.1; 430/944; 430/945
[58] Field of Search .................... 430/271.1, 944, 430/945

[56] References Cited

U.S. PATENT DOCUMENTS

| | | | |
|---|---|---|---|
| 4,388,400 | 6/1983 | Tabei et al. | 430/346 |
| 4,405,706 | 9/1983 | Takahasi et al. | 430/271 |
| 4,499,178 | 2/1985 | Wada et al. | 430/495 |
| 4,983,505 | 1/1991 | Higuchi et al. | 430/495 |
| 5,147,490 | 9/1992 | Leenders et al. | 156/238 |
| 5,656,410 | 8/1997 | Van Damme et al. | 430/256 |
| 5,776,575 | 7/1998 | Hiraoka et al. | 428/64.1 |

FOREIGN PATENT DOCUMENTS

| | | |
|---|---|---|
| 684 145 A1 | 5/1995 | European Pat. Off. ......... B41M 5/26 |
| 0 684 145 | 11/1995 | European Pat. Off. . |
| 0 687 569 | 12/1995 | European Pat. Off. . |
| 803 376 A1 | 4/1997 | European Pat. Off. ......... B41M 5/24 |
| 0 803 376 | 10/1997 | European Pat. Off. . |
| 7-237276 | 9/1995 | Japan . |

*Primary Examiner*—Janet Baxter
*Assistant Examiner*—Barbara Gilmore
*Attorney, Agent, or Firm*—Breiner & Breiner

[57] ABSTRACT

A heat mode element with improved mechanical properties is disclosed comprising a transparent support, a thin metallic recording layer, an adhesive layer, a polymeric resin layer and a top layer comprising a roughening agent in such an amount that the $R_a$ value of said top layer is at least 0.08 μm and the $R_z$ value is at least 0.6 μm. In a preferred embodiment the metallic recording layer is a bismuth layer, and the support has on the other side a backing layer with a low $R_a$ and $R_z$ value.

In an alternative embodiment the top layer is absent and the roughening agent is incorporated in the polymeric resin layer itself.

Also disclosed is a method for obtaining a heat mode image by the information-wise laser exposure of the disclosed element.

10 Claims, No Drawings

HEAT MODE RECORDING ELEMENT BASED ON A THIN METALLIC RECORDING LAYER

The application claims the benefit of U.S. Provisional Application No. 60/053,360 filed Jul. 17, 1997.

1. Field of the Invention

The present invention relates to a heat mode recording element based on a thin metallic recording layer, with improved mechanical properties.

2. Background of the Invention

In a particular type of heat mode recording materials information is recorded by creating differences in reflection and/or in transmission on the recording layer. The recording layer has high optical density and absorbs radiation beams which impinge thereon. The conversion of radiation into heat brings about a local temperature rise, causing a thermal change such as evaporation or ablation to take place in the recording layer. As a result, the irradiated parts of the recording layer are totally or partially removed, and a difference in optical density is formed between the irradiated parts and the unirradiated parts (cf. U.S. Pat. Nos. 4,216,501, 4,233,626, 4,188,214 and 4,291,119 and British Pat. No. 2,026,346)

The recording layer of such heat mode recording materials is usually made of metals, dyes, or polymers. Recording materials like this are described in 'Electron, Ion and Laser Beam Technology", by M. L. Levene et al.; The Proceedings of the Eleventh Symposium (1969); "Electronics" (Mar. 18, 1968), P. 50; "The Bell System Technical Journal", by D. Maydan, Vol. 50 (1971), P. 1761; and "Science", by C. O. Carlson, Vol. 154 (1966), P. 1550.

Recording on such thermal recording materials is usually accomplished by converting the information to be recorded into electrical time series signals and scanning the recording material with a laser beam which is modulated in accordance with the signals. This method is advantageous in that recording images can be obtained on real time (i.e. instantaneously). Recording materials of this type are called "direct read after write" (DRAW) materials. DRAW recording materials can be used as a medium for recording an imagewise modulated laser beam to produce a human readable or machine readable record. Human readable records are e.g. micro-images that can be read on enlargement and projection. An example of a machine readable DRAW recording material is the optical disc. To date for the production of optical discs tellurium and its alloys have been used most widely to form highly reflective thin metal films wherein heating with laser beam locally reduces reflectivity by pit formation (ref. e.g. the periodical 'Physik in unserer Zeit', 15. Jahrg. 1984/Nr. 5, 129–130 the article "Optische Datenspeicher" by Jochen Fricke). Tellurium is toxic and has poor archival properties because of its sensitivity to oxygen and humidity. Other metals suited for use in DRAW heat-mode recording are given in U.S. Pat. No. 4,499,178 and U.S. Pat. No. 4,388,400. To avoid the toxicity problem other relatively low melting metals such as bismuth have been introduced in the production of a heat-mode recording layer. By exposing such a recording element very shortly by pulses of a high-power laser the writing spot ablates or melts a small amount of the bismuth layer. On melting the layer contracts on the heated spot by surface tension thus forming small cavitations or holes. As a result light can pass through these cavitations and the density is lowered to a certain Dmin value depending on the laser energy irradiated.

According to EP 0 384 041 a process is provided for the production of a heat mode recording material having "direct read after write" (DRAW) possibilities wherein a web support is provided with a heat mode recording thin metal layer, preferably a bismuth layer, characterized in that in the same vacuum environment a protective organic resin layer in web form is laminated to said supported recording layer by means of an adhesive layer.

A commercially available material manufactured according to the principles of cited EP 0 384 041 is MASTERTOOL MT8, registered trade name, marketed by Agfa-Gevaert N.V. It is mostly used after recording as master in the manufacturing of microelectronic circuits and printed circuit boards. We refer to the description in *Circuit World*, Vol. 22, No. 3, April 1996. The material comprises a double-sided subbed polyethylene terephthalate (PET) support, carrying on one side a bismuth layer of about 0.25 μm thickness deposited in vacuo, a 8 μm thick weak adhesive layer, and a thin PET protective layer of 12 μm thickness. On the other side of the subbed PET support a backing layer is provided containing an antistatic and a matting agent (or roughening agent, or spacing agent, terms that will be used as synonyms furtheron). The matting agent prevents sticking to each other of packaged MASTERTOOL sheets, a phenomenon that is likely to lead to transport problems in exposure devices.

However, a MASTERTOOL material designed as described above shows following drawbacks. When a recorded pattern on MASTERTOOL is copied onto a photoresist firstly the air is removed by vacuum sucking out of the MASTERTOOL/resist sandwich, the 12 μm PET top layer of MASTERTOOL being in contact with the PET of the resist. When the vacuum sucking is performed rapidly vacuum bubbles are likely to occur being randomly distributed areas wherein the air is not fully removed. Especially in applications where fine lines (at most 100 μm) are to be copied these vacuum bubbles are disturbing since resolution between the lines is lost due to the increased distance between the information carrying layer and the information accepting layer.

Another kind of problem occurs in particular exposing devices for double-sided exposure of a PCB. For example, when two MT8 sheets, which adhere each by a vacuum 1 to the transparent plates of the exposure unit, and which face each other with the thin PET side, are positioned by pressing them to each other by means of a vacuum 2 without resist lying inbetween, and the vacuum 2 is disrupted for separating MT 1 and MT 2 in order to insert a resist, the two MT8 sheets tend to stick to each other even so strongly that vacuum 1 is disrupted and the positioning procedure must be repeated.

As a third drawback must be mentioned that the material is so mobile on the glass plate of the exposure device so that minimal stresses occuring during mounting induce planar unevenesses in the mounted sheet. This is particularly disturbing in applications wherein fine lines (at most 100 μm) are to be copied.

It is an object of the present invention to provide a heat mode recording element showing no transport problems in exposure devices.

It is a further object of the present invention to provide a heat mode recording element that shows no formation of bubbles on vacuum sucking.

It is a still further object of the present invention to provide a heat mode recording element which is suitable for the reproduction of fine lines (100 μm and less).

3. SUMMARY OF THE INVENTION

The objects of the present invention are realized by providing a heat mode recording element comprising, in order, (1) a transparent support,
(2) a thin metallic recording layer,
(3) an adhesive layer,
(4) a polymeric resin layer,
   characterized in that it further comprises on top of layer (4) a layer (5) containing a roughening agent in such an amount that the $R_a$ value of said layer (5) is at least 0.08 μm and the $R_z$ value of said layer (5) is at least 0.6 μm. Most preferably the $R_a$ value is at least 0.15 μm and the $R_z$ value is at least 1.2 μm.

By metallic layer is meant a layer based on a metal, a metal oxide, a metal chalcogenide such as a sulphide, an alloy of at least two metals, or mixtures of these different species.

In a preferred embodiment the transparent support carries on the other side a backing layer (6) having a $R_a$ value of at most 0.2 μgm and a $R_z$ value of at most 4 μm. Most preferably, these $R_a$ and $R_z$ values are at most 0.15 μm and 2 μm respectively.

In an alternative embodiment of the present invention layer (5) is absent and the roughening agent is incorporated in the polymeric resin layer itself.

4. DETAILED DESCRIPTION OF THE INVENTION

The different elements constituting the heat mode recording material of the present invention will now be explained in more detail.

Useful transparent organic resin supports include e.g. cellulose nitrate film, cellulose acetate film, polyvinylacetal film, polystyrene film, polyethylene terephthalate film, polycarbonate film, polyvinylchloride film or poly-Alpha-olefin films such as polyethylene or polypropylene film. The thickness of such organic resin film is preferably comprised between 0.07 and 0.35 mm. In a most preferred embodiment of the present invention the support is a polyethylene terephthalate layer provided with a subbing layer. This subbing layer can be applied before or after stretching of the polyester film support. The polyester film support is preferably biaxially stretched at an elevated temperature of e.g. 70–120° C., reducing its thickness by about ½ to ⅕ or more and increasing its area 2 to 9 times. The stretching may be accomplished in two stages, transversal and longitudinal in either order or simultaneously. The subbing layer is preferably applied by aqueous coating between the longitudinal and transversal stretch, in a thickness of 0.1 to 5 μm. In case of a bismuth recording layer the subbing layer preferably contains, as described in European Patent Application EP 0 464 906, a homopolymer or copolymer of a monomer comprising covalently bound chlorine. Examples of said homopolymers or copolymers suitable for use in the subbing layer are e.g. polyvinyl chloride, polyvinylidene chloride, a copolymer of vinylidene chloride, an acrylic ester and itaconic acid, a copolymer of vinyl chloride and vinylidene chloride, a copolymer of vinyl chloride and vinyl acetate, a copolymer of butylacrylate, vinyl acetate and vinyl chloride or vinylidene chloride, a copolymer of vinyl chloride, vinylidene chloride and itaconic acid, a copolymer of vinyl chloride, vinyl acetate and vinyl alcohol etc. Polymers that are water dispersable are preferred since they allow aqueous coating of the subbing layer which is ecologically advantageous.

Possible metals for the recording layer in this invention include Mg, Sc, Y, Ti, Zr, Hf, V, Nb, Ta, Cr, Mo, W, Mn, Re, Fe, Co, Ni, Ru, Rh, Pd, Ir, Pt, Cu, Ag, Au, Zn, Cd, Al, Ga, In, Si, Ge, Sn, As, Sb, Bi, Se, Te. These metals can be used alone or as a mixture or alloy of at least two metals therof. Due to their low melting point Mg, Zn, In, Sn, Bi and Te are preferred. The most preferred metal for the practice of this invention is Bi. As stated above, also metal oxides, metal chalcogenides, alloys of at least two metals, and mixtures of these different species can be used.

The metallic recording layer may be applied by vapor deposition, sputtering, ion plating, chemical vapor deposition, electrolytic plating, or electroless plating. In the preferred case of Bi the recording layer is preferably provided by vapor deposition in vacuo. A method and an apparatus for such a deposition are disclosed, in EP 0 384 041, cited above.

The thickness of this Bi layer is preferably comprised between 0.1 and 0.6 μm. When this thickness is too low the recorded images do not have sufficient density. When on the other hand the thickness is too high the sensitivity tends to decrease and the minimal density, i.e. the density after laser recording on the exposed areas tends to be higher.

Since the metallic layer is very sensitive to mechanical damage a protective element must be provided on top of the metallic layer. This protective element comprises a transparent organic resin, acting as cover sheet, and an adhesive layer, A method for applying such a protective element by lamination in the same vacuum environment as wherein the deposition of the metal layer took place is also disclosed in EP 0 384 041, cited above. The cover sheet can be chosen from the group of polymeric resins usable for the support of the heat mode element. In a preferred embodiment the cover sheet is also polyethylene terephthalate but preferably substantially thinner than the polyethylene terephthalate of the support. The cover sheet may be provided with a subbing layer to improve the adhesion to the adhesive layer.

For the adherence of the hard protective outermost resin layer to the heat mode recording layer preferably a layer of a pressure-sensitive adhesive resin can be used. Examples of such resins are described in U.S. Pat. No. 4,033,770 for use in the production of adhesive transfers (decalcomanias) by the silver complex diffusion transfer process, in the Canadian Patent 728,607 and in the U.S. Pat. No. 3,131,106.

Instead of an outermost layer + pressure adhesive an outermost layer + thermoadhesive can be used. In the latter case the material is less susceptible to wrinkles.

Pressure-sensitive adhesives are usually composed of (a) thermoplastic polymer(s) having some elasticity and tackiness at room temperature (about 20° C.), which is controlled optionally with a plasticizer and/or tackifying resin. A thermoplastic polymer is completely plastic if there is no recovery on removal of stress and completely elastic if recovery is instantaneous and complete.

Particularly suitable pressure-sensitive adhesives are selected from the group of polyterpene resins, low density polyethylene, a copoly(ethylene/vinyl acetate), a poly $(C_1-C_{16})$alkyl acrylate, a mixture of poly$(C_1-C_{16})$alkyl acrylate with polyvinyl acetate, and copoly(vinylacetate-acrylate) being tacky at 20° C.

In the production of a pressure-adhesive layer an intrinsically non-tacky polymer may be tackified by the adding of a tackifying substance, e.g. plasticizer or other tackifying resin.

Examples of suitable tackifying resins are the terpene tackifying resins described in the periodical "Adhesives Age", Vol. 31, No. 12, November 1988, p. 28–29.

According to another embodiment the protective element is laminated or adhered to the heat-mode recording layer by means of a heat-sensitive also called heat-activatable adhesive layer or thermoadhesive layer, examples of which are described also in U.S. Pat. No. 4,033,770. In such embodiment the laminating material consisting of adhesive layer and abrasion resistant protective layer and/or the recording web material to be protected by lamination are heated in their contacting area to a temperature beyond the softening point of the adhesive. Heat may be supplied by electrical energy to at least one of the rollers between which the laminate is formed or it may be supplied by means of infra-red radiation. The laminating may proceed likewise by heat generated by high-frequency micro-waves as described e.g. in published EP-A 0 278 818 directed to a method for applying a plastic covering layer to documents.

A survey of pressure and/or heat-sensitive adhesives is given by J. Shields in "Adhesives Handbook", 3rd. ed. (1984), Butterworths—London, Boston, and by Ernest W. Flick in "Handbook of Adhesive Raw Materials" (1982), Noyens Publications, Park Ridge, New Jersey—USA.

Essential to the present invention is the presence of a top layer (5) having a minimal degree of roughness. The degree of roughness of layer (5) is best characterized by the so-called Ra value. This so-called average roughness value is defined as the arithmic average value of the absolute amounts of all the measured distances of the roughness profile from the middle line within the measured interval. Layer (5) has a $R_a$ value of at least 0.08 μm. Another value characterizing the roughness is the so-called $R_z$ value defined as follows : arithmic mean of the individual peak-to-valley heights of each of the five central segments of the digitally filtered profile where each segment is 1/5 of the measurement traverse in length as defined in the standard.

Layer (5) has a $R_z$ value of at least 0.6 μm.

The roughening agent can be chosen from a wide variety of chemical classes and commercial products provided the particles chosen show an excellent mechanical and thermal stability. Preferred roughening agents include following:

the spherical polymeric beads disclosed in U.S. Pat. No. 4,861,818;

the alkali-soluble beads of U.S. Pat. No. 4,906,560 and EP 0 584 407;

the insoluble polymeric beads disclosed in EP 0 466 982;

polymethylmethacrylate beads;

copolymers of methacrylic acid with methyl- or ethyl-methacrylate;

TOSPEARL siloxane particles (e.g. types T105, T108, T103, T120), marketed by Toshiba Co;

SEAHOSTAR polysiloxane—silica particles (e.g. type KE-P50), marketed by Nippon Shokubai Co;

ROPAQUE particles, being polymeric hollow spherical core/sheat beads, marketed by Rohm and Haas Co, and described e.g. is U.S. Pat. Nos. 4,427,836, 4,469,498 and 4,469,825;

ABD PULVER, markted by BASF AG;

CHEMIPEARL, spherical poymeric particles, marketed by Misui Petrochemical Industries, Ltd.μ

The spacing particles must be chosen so that they are not optically disturbing.

In a most preferred embodiment the roughening agents is composed of polymethylmethacrylate beads which are preferably cross-linked. They preferably have an average particle size of 1 to 5 μm, and most preferably 2 to 4 μm. Other pr eferred roughening agents are disclosed in EP 0 080 225, EP 0 466 982, and EP 0 698 625.

The rough top layer (5) used in accordance with the present invention can be coated from an aqueous medium or from an organic solvent. In the first case the aqueous coating solution contains a hydrophilic binder, preferably gelatin. Other hydrophilic binders include polyvinylalcohol, polyvinylpyrrolidone, cellulose derivatives, etc. Alternatively, the rough top layer (5) can be coated from an organic solvent, e.g. methylethylketone or acetone, or mixtures. In this case preferred binders are polymethylmethacrylate and copolyesters. Most preferred binders are copolyesters since they improve the adhesion in case when the PET support is unsubbed.

As a further alternative, the top layer (5) is not applied by coating, but by spraying a polymer containing solution. After drying a discontinuous polymer film is formed which can give the appropriate surface roughness.

In an alternative embodiment of the present invention top layer (5) is not present and the roughening agent is simply incorporated in the thin polymeric resin layer which then obeys to the same range of $R_a$ and $R_z$ values. In this case the roughening agents are preferably inorganic substances, e.g. crystalline silica and calcium carbonate, since they have to be added before the melting and extrusion of the polymer, e.g. PET granules, processes occuring at high temperatures. A commercial example of such a roughened thin PET foil is HOSTAPHAN MP12, marketed by Diafoil Co.

It was further found surprisingly that by the addition of a roughening agent in the extra top layer or in the thin polymeric resin layer itself according to the invention the useful exposure latitude of the finished heat mode element was extended. When no roughening agent is present cloudiness tends to appear in full recorded areas when the exposure range is under the optimal value thereby limiting the useful exposure range. It is believed that by the addition of a roughening agent the haze is increased and as a consequence interference phenomena, which are believed to be the source of the cloudiness, are reduced.

For the formation of a heat mode image using the element of the present invention any laser can be used which provides enough energy needed for the production of sufficient heat for this particular process of image formation. In a preferred embodiment a powerful infra-red laser is used, most preferably a Nd-YLF laser.

The present invention will be illustrated now by the following example without however being limited thereto.

EXAMPLES

Example 1

Preparation of Samples

The application of a bismuth layer by vacuum deposition onto a PET support and of a protective laminate consisting of an adhesive layer and of a PET protective layer were performed according to the process described in EP 0 384 041, cited above. A cylindrical vacuum chamber contained an electrically heated refractory tray in which bismuth is present as metal vapour source. Under high vacuum (a pressure in the range of $10^{-2}$ Pa to $8 \times 10^{-1}$ Pa) the obtained metal vapour was directed towards a web made of polyethylene terephthalate having a thickness of 175 μm and was deposited thereon at a thickness of about 300 nm. The web was supplied by an unwinding roll and was conveyed over a guiding roller against a cooled support roller. After passing the zone of the metal vapour deposition the web traveled upwardly to meet a laminating web. The laminating web consisted of a three layer pack composed of (a) a 23 μm thick releasable temporary support (siliconised PET), (b) a 8 μm thick pressure adhesive layer (acrylate based), and (c) a 12 μm PET protective layer. By a mechanism explained in the cited patent the releasable layer (a) was first peeled off, and the layers (b) and (c) were laminated by means of pressure rollers to the deposited bismuth layer.

Four different samples were prepared some of which were provided with a backing layer and a top layer according to following specifications (table 1):

TABLE 1

| Sample No. | rough top layer | | | backing layer | | |
|---|---|---|---|---|---|---|
| | | $R_a$ | $R_z$ | | $R_a$ | $R_z$ |
| I comparison | no | 0.06 | 0.52 | yes | 0.02 | 0.2 |
| II comparison | no | 0.06 | 0.52 | yes | 0.21 | 2.2 |
| III invention | yes | 0.2 | 1.6 | yes | 0.21 | 2.2 |
| IV invention | yes | 0.2 | 1.6 | yes | 0.03 | 0.45 |

The rough top layer used in accordance with the present invention (samples III and IV) had following composition (expressed as dry substance per m$^2$):binder copolyester VITEL 2200 (Bostik Inc.) 750 mg/M$^2$, roughening agent cross-linked polymethylmethacrylate beads (average size 3 µm) 20 mg/m$^2$. The layer was coated from a methylethylketone solution which was removed on drying.

The backing layer had following ingredients antistatic complex polyethylenedioxythiophene/polystyrene sulphonic acid;

binder polymethylmethacrylate latex (0.15–0.4 µm);

thickener polysaccharide KELZAN S (trademark of Kelco Co.);

polyethylene latex (0.2 µm) PERAPRET PE40 (tradename of BASF);

colloidal silica KIESELSOL 100F (trade name of Bayer AG);

wetting agent ULTRAVON W (trade name of Ciba-Geigy AG).

In samples II and III the backing layer further contained roughening agent polymethylmethacrylate beads (average size 6 µm) 30 mg/m$^2$.

In sample IV polymethylmethacrylate beads of average size 3 µm were present in the backing layer in a concentration of only 0.3 mg/m$^2$.

The backing layer was coated from a mixture of N-methylpyrrolidone and isopropanol.

Evaluation

The quality of transport properties, vacuum sucking and rendering of fine lines (100 µm or less) are summarized in table 2 in a qualitative way (+ meaning good, and – meaning bad).

TABLE 2

| sample | quality of | | |
|---|---|---|---|
| | transport | vacuum | 100 µm line rendering |
| I comparison | – | – | – |
| II comparison | + | – | – |
| III invention | + | + | – |
| IV invention | + | + | + |

It is clear that in the preferred embodiment of the present invention (sample IV) wherein the top layer is rough and the backing layer is smooth a heat mode element is obtained with no transport problems, no problems with the removal of air between the MASTERTOOL/resist sanwich, and suitable for the fine line technology class.

Example 2

Sample III of the previous example was considered again. Sample V was the same as sample III except that the rough top layer was washed away with methyl ethyl ketone. Sample VI was the same as sample III except that a rough top layer with polymethylmethacrylate binder (500 mg/m$^2$) and crosslinked polymethylmethacrylate beads (average size 3 µm, 30 mg/m$^2$) was used.

Sample VII was the same as sample VI except that the rough top layer was washed away with methylethylketone.

All the samples were for 100% recorder By a Barco ELISE high power laser. Exposure energies ranging from 3.5 W to 4.3 W were used. A qualitative evaluation of the cloudiness (0 meaning not cloudy, 4 meaning very cloudy) is summarized in table 3.

TABLE 3

| exposure power (W) | 3.5 | 3.7 | 3.9 | 4.1 | 4.3 |
|---|---|---|---|---|---|
| sample III | 1 | 1 | 0 | 0 | 0 |
| sample V | 2–3 | 2–3 | 1–2 | 0–1 | 0–1 |
| sample VI | 3–4 | 2–3 | 1–3 | 0–2 | 0–1 |
| sample VII | 4 | 3 | 2–3 | 1–2 | 0–1 |

As it is clear from the table samples III and VI which are the samples with a rough top layer are less cloudy than sample V and sample VII respectively. The top layer increases the exposure latitude of the material.

We claim:

1. Heat mode recording element comprising, in order, (1) a transparent support, (2) a thin metallic recording layer, (3) an adhesive layer, (4) a polymeric resin layer, further comprising on top of layer (4) a layer (5) containing a roughening agent in such an amount that a $R_a$ value of said layer (5) is at least 0.08 µm and a $R_z$ value of said layer (5) is at least 0.6 µm, and further comprising on the other side of the transparent support (1) a backing layer (6) having a $R_a$ value of at most 0.2 µm and a $R_z$ value of at most 4 µm.

2. Heat mode recording element according to claim 1 wherein the $R_a$ value of said layer (5) is at least 0.15 µm and the $R_z$ value of said layer (5) is at least 1.2 µm.

3. Heat mode recording element according to claim 1 wherein said backing layer (6) has a $R_a$ value of at most 0.15 µm and a $R_z$ value of at most 2 µm.

4. Heat mode recording element according to claim 1 wherein said roughening agent present in layer (5) is polymethylmethacrylate.

5. Heat mode recording element according to claim 1 wherein said thin metallic recording layer is a bismuth layer having a thickness between 0.05 and 0.6 µm.

6. Heat mode recording element comprising, in order, (1') a transparent support, (2') a thin metallic recording layer, (3') an adhesive layer, (4') a polymeric resin layer, wherein said layer (4') contains a roughening agent in such an amount that a $R_a$ value of said layer (4') is at least 0.08 µm and a $R_z$ value of said layer (4') is at least 0.6 µm, and further comprising on the other side of the transparent support (1')

a backing layer (6') having a $R_a$ value of at most 0.2 μm and a $R_z$ value of at most 4 μm.

7. Heat mode recording element according to claim 6 wherein the $R_a$ value of said layer (4') is at least 0.15 μm and the $R_z$ value of said layer (4') is at least 1.2 μm.

8. Heat mode recording element according to claim 6 wherein said backing layer (6') has a $R_a$ value of at most 0.15 μm and a $R_z$ value of at most 2 μm.

9. Heat mode recording element according to claim 6 wherein said roughening agent present in layer (4') is polymethylmethacrylate.

10. Heat mode recording element according to claim 6 wherein said thin metallic recording layer is a bismuth layer having a thickness between 0.05 and 0.6 μm.

* * * * *